United States Patent
Cheng

(10) Patent No.: US 8,446,081 B2
(45) Date of Patent: May 21, 2013

(54) HEAT DISSIPATION DEVICE FOR LED LAMP

(76) Inventor: Sheng-Hsiung Cheng, New Taipei (TW)

( * ) Notice: Subject to any disclaimer, the term of this patent is extended or adjusted under 35 U.S.C. 154(b) by 0 days.

(21) Appl. No.: 13/548,214

(22) Filed: Jul. 13, 2012

(65) Prior Publication Data

US 2012/0275156 A1      Nov. 1, 2012

Related U.S. Application Data

(63) Continuation-in-part of application No. 12/469,704, filed on May 21, 2009, now abandoned.

(51) Int. Cl.
*H01J 1/62* (2006.01)

(52) U.S. Cl.
USPC ............. 313/46; 313/506; 362/218; 362/373

(58) Field of Classification Search
USPC ............... 313/46, 506; 362/218, 249.02, 294, 362/373
See application file for complete search history.

(56) References Cited

U.S. PATENT DOCUMENTS

2004/0184272 A1*   9/2004   Wright et al. ................. 362/373

* cited by examiner

*Primary Examiner* — Vip Patel
(74) *Attorney, Agent, or Firm* — Leong C. Lei

(57) ABSTRACT

The heat dissipation device for a LED lamp contains an upper piece, at least a lower piece, and a number of heat dissipation elements. The upper piece has a number of first, second, and third plug holes. The second plug holes are aligned with some first plug holes, and they are connected by conductive layers. The other first plug holes are connected by separate conductive layers. The third plug holes are configured on individual conductive layers. A number of LEDs have their leads threaded through the first plug holes, respectively. The heat dissipation elements have their two ends threaded through a second plug hole and a third plug hole, respectively. The leads and the heat dissipation elements are then soldered to their respective conductive layers. A number of tubular sleeves are sandwiched between the upper and lower pieces and the leads of the LEDs are threaded through the tubular sleeves.

12 Claims, 8 Drawing Sheets

HEAT DISSIPATION DEVICE FOR LED LAMP

CROSS-REFERENCE TO RELATED APPLICATION

This application is a continuation-in-part of the patent application Ser. No. 12/469,704 filed May 21, 2009 now abandoned, owned by the same applicant.

TECHNICAL FIELD OF THE INVENTION

The present invention is generally related to LED lamps, and more particularly to a heat dissipation device for a LED lamp that is low-cost, easy-to-manufacture, of superior heat dissipation, and with a small dimension.

DESCRIPTION OF THE PRIOR ART

LED lamps are widely popular and applied in recent years due to its low power consumption and high brightness. However, the heat produced by the LEDs often reduces the lift span of the LEDs or causes damage. An ordinary LED lamp therefore is configured with a heat dissipation structure for dissipating the heat and thereby maintaining the normal functionality of the LEDs. A conventional heat dissipation structure of a LED lamp has a large heat dissipating area, and is configured with an array of fins. However, the dimension of the LED lamp as such cannot be reduced, the production cost is high, and product competitiveness is inferior.

SUMMARY OF THE INVENTION

Therefore, a major objective of the present invention is to provide a novel heat dissipation device so that the LED lamp is low-cost, easy-to-manufacture, of superior heat dissipation, and with a small dimension.

The heat dissipation device for a LED lamp contains an upper piece, at least a lower piece, and a number of heat dissipation elements. The upper piece has a number of first, second, and third plug holes. The second plug holes are aligned with some first plug holes, and they are connected by conductive layers. The other first plug holes are also aligned and connected by separate conductive layers. The third plug holes are adjacent to the second plug holes and each third plug hole is configured on an individual conductive layer. A number of LEDs have their leads threaded through the first plug holes, respectively. Then, the heat dissipation elements have their two ends threaded through a second plug hole and a third plug hole, respectively. The leads and the heat dissipation elements are then soldered to their respective conductive layers. A number of tubular sleeves are sandwiched between the upper and lower pieces and the leads of the LEDs are threaded through the tubular sleeves. When LEDs are turned on, the heat produced by the LEDs is dissipated through the leads which are reserved for an appropriate length, the conductive layers which have a certain extended area, and the heat dissipation elements among the LEDs. As such, the dimension of the LED lamp can be reduced with enhanced heat dissipation effect, thereby achieving lower cost.

Preferably, the heat dissipation element is of a reversed-U shape, and is made of a heat dissipating metallic material.

Preferably, the upper and lower pieces are circuit boards, and the conductive layers are the printed circuits on the circuit boards.

Preferably, the printed circuits on the circuit board can be single-side or two-sided, so as to increase heat dissipating area.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention, is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
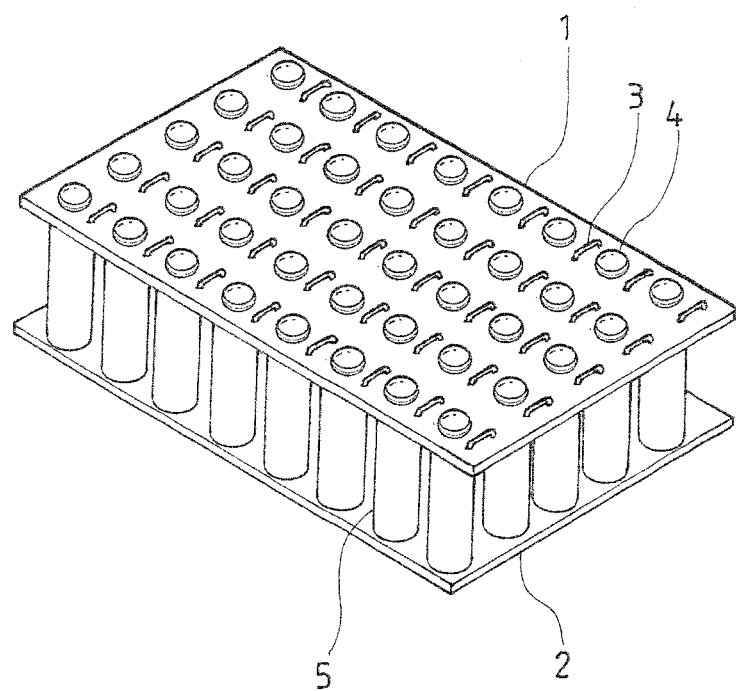
FIG. 1 is a perspective diagram showing a heat dissipation device according to a first embodiment of the present invention.
Figure 2:
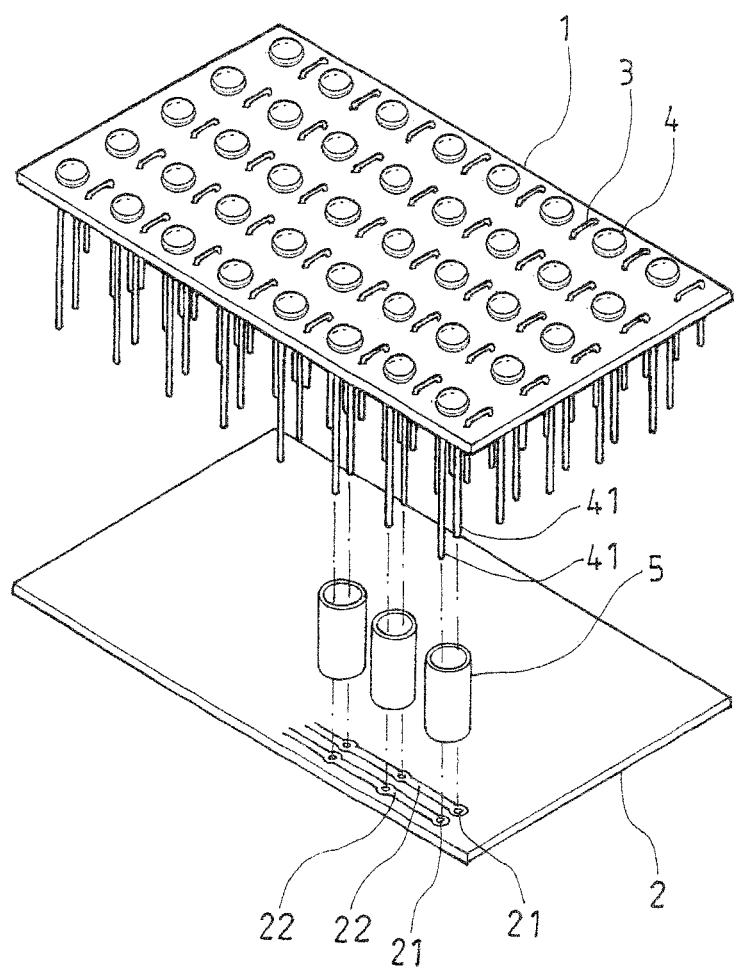
FIG. 2 is a perspective break-down diagram showing the heat dissipation device of FIG. 1.
Figure 3:
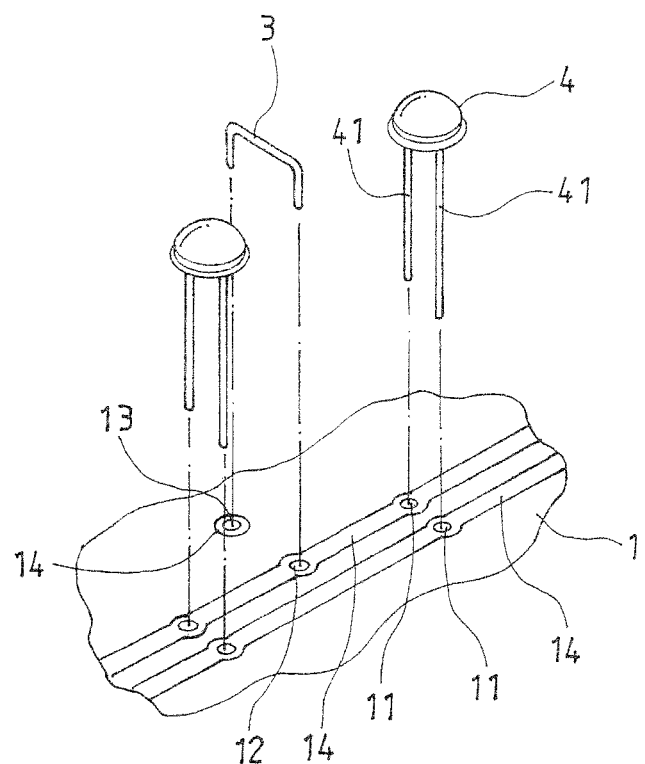
FIG. 3 is another perspective break-down diagram showing the heat dissipation device of FIG. 1.

As shown in FIGS. 1 to 3, a heat dissipation device according to a first embodiment of the present invention contains an upper piece 1, at least a lower piece 2, and a number of heat dissipation elements 3. The upper piece 1 has a number of first, second, and third plug holes 11, 12, and 13. The second plug holes 12 are aligned with some first plug holes 11, and they are connected by conductive layers 14. The other first plug holes 11 are also aligned and connected by separate conductive layers 14. The third plug holes 13 are adjacent to the second plug holes 12 and each third plug hole 13 is configured on an individual conductive layer 14. In the present embodiment, the upper and lower pieces 1 and 2 are circuit boards, and the conductive layers 14 and 22 are the printed circuits on the upper and lower pieces 1 and 2. The circuits on the circuit board can be single-sided, or two-sided.

The lower piece 2 has a number of fourth plug holes 21, each corresponding to a first plug hole 11 on the upper piece 1. The fourth plug holes 21 are also aligned and connected by separate conductive layers 22.

The heat dissipation elements 3, in the present embodiment, are of a reversed-U shape and could be made of iron or other metallic material that is heat dissipating and can be soldered.

When the heat dissipation device of the present embodiment is assembled, a number of LEDs 4 have their leads 41 threaded through the first plug holes 11, respectively, and an appropriate length of each lead 41 is reserve. Then, a number of heat dissipation elements 3 have their two ends threaded through a second plug hole 12 and a third plug hole 13, respectively. The leads 41 and the heat dissipation elements 3 are then soldered to their respective conductive layers 14. The leads 41 of each LED 4 are then threaded through tubular sleeves 5 of appropriate length, and further through two fourth plug holes 21, respectively, and soldered to the conductive layers 22. As such, the tubular sleeves 5 are sandwiched between the upper and lower pieces 1 and 2 and the two ends of the tubular sleeves 5 are against the upper and lower pieces I and 2, respectively.

Figure 4:
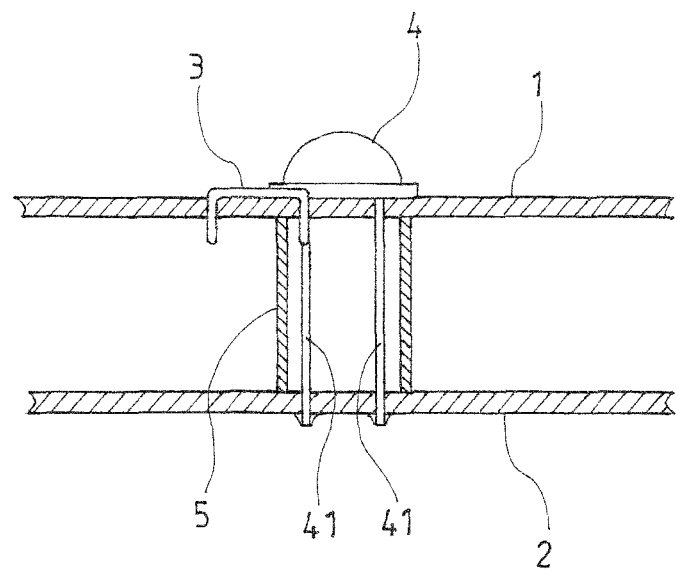
FIG. 4 is a sectional diagram showing the heat dissipation device of FIG. 1.

The forgoing assembly then forms a LED lamp whose LEDs 4 are turned on after applying electricity to the conductive layers 14. As shown in FIG. 4, the heat produced by the LEDs 4 is dissipated through the leads 41 which are reserved for an appropriate length, the conductive layer 14 which has a certain extended area, and the heat dissipation elements 3. As the leads 41 are extended to the conductive layers 22 on the lower piece 2, the heat will also dissipated from the conductive layers 22. The manufacturing process of the LED lamp is therefore simpler and the dimension of the LED lamp can be reduced with enhanced heat dissipation effect, thereby achieving lower cost.

Figure 5:
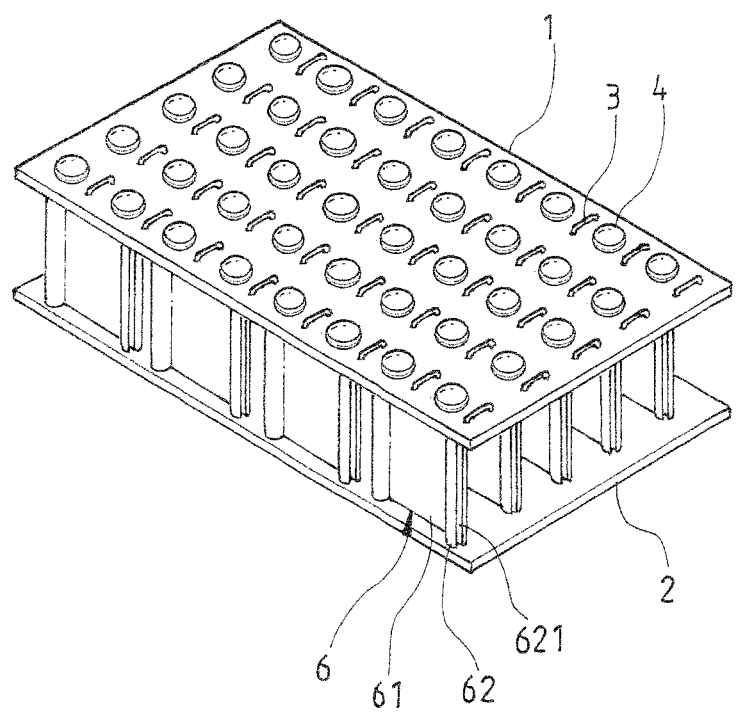
FIG. 5 is a perspective diagram showing a heat dissipation device according to a second embodiment of the present invention.
Figure 6:
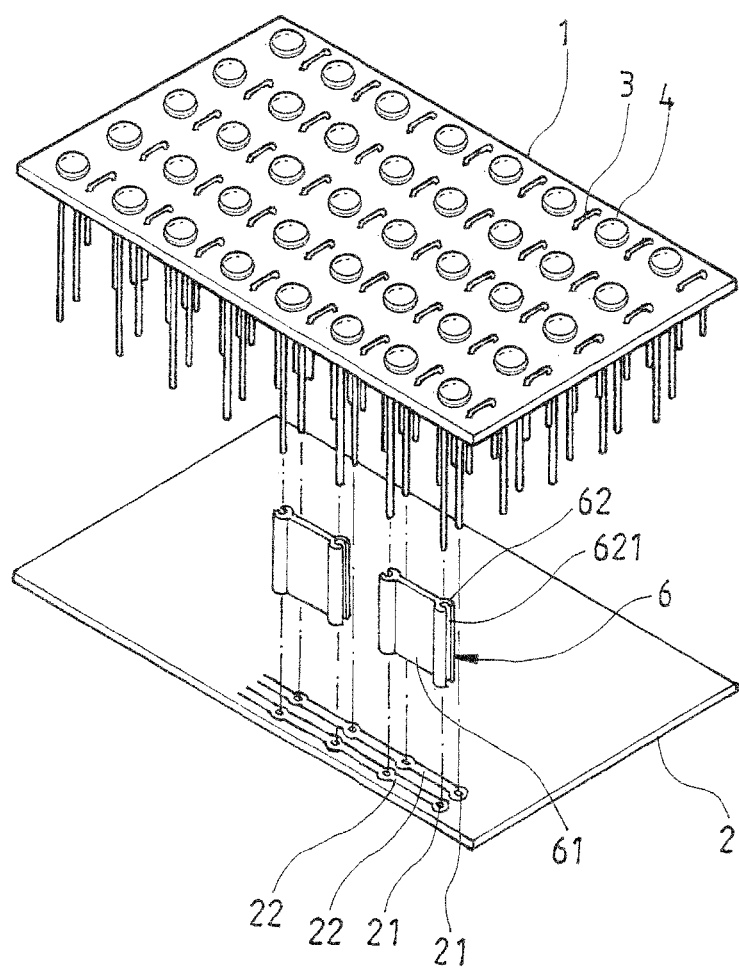
FIG. 6 is a perspective break-down diagram showing the heat dissipation device of FIG. 5.

As shown in FIGS. 5 and 6, a heat dissipation device according to a second embodiment of the present invention replaces the tubular sleeves 5 of the previous embodiment with heat dissipation pieces 6. Each heat dissipation piece 6 has a piece body 61 whose two lateral sides are configured with tubular sections 62, respectively. Each tubular section 62 has an axially extended slot opening 621 so as to establish an appropriate flexibility.

When the heat dissipation device of the present embodiment is assembled, a number of LEDs 4 have their leads 41 threaded through and soldered to the upper piece 1. Two adjacent LEDs 4 further have their leads 41 threaded through the two tubular sections 62 of a heat dissipation piece 6, and then through the fourth plug holes 21 of the lower piece 2. Since each tubular section 62 has a slot opening 621 and thereby a certain flexibility the leads 41 can be easily threaded through and reliably held by the tubular section 62. The heat dissipation pieces 6 are then sandwiched between the upper and lower pieces 1 and 2, and their upper and lower edges are against the upper and lower pieces 1 and 2, respectively. The leads 41 of the LEDs 4 then can be soldered to the conductive layers 22 of the lower piece 2.

Figure 7:
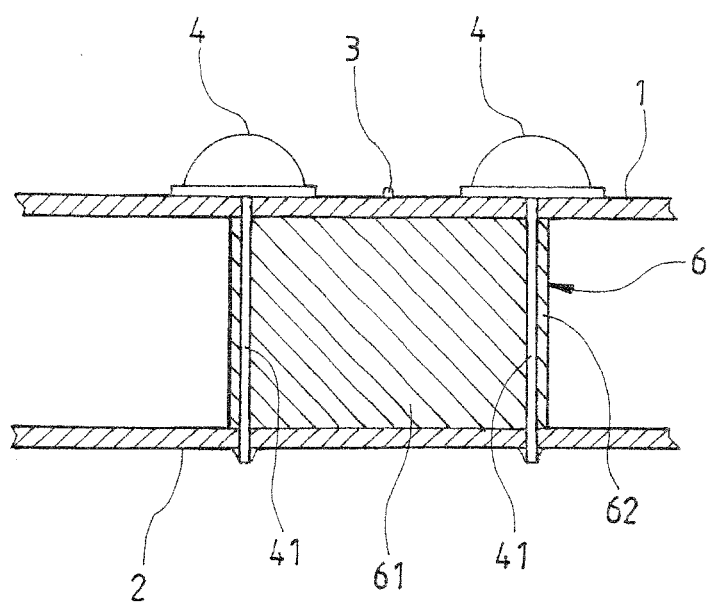
FIG. 7 is a sectional diagram showing the heat dissipation device of FIG. 5.

As shown in FIG. 7, when the LEDs 4 are turned on, the heat produced by the LEDs 4 is dissipated through the leads 41 which are reserved for an appropriate length, the conductive layers 14 and 22 on the upper and lower pieces 1 and 2 which have certain extended areas, and the heat dissipation pieces 6 between the leads 41 of the LEDs 4.

Figure 8:
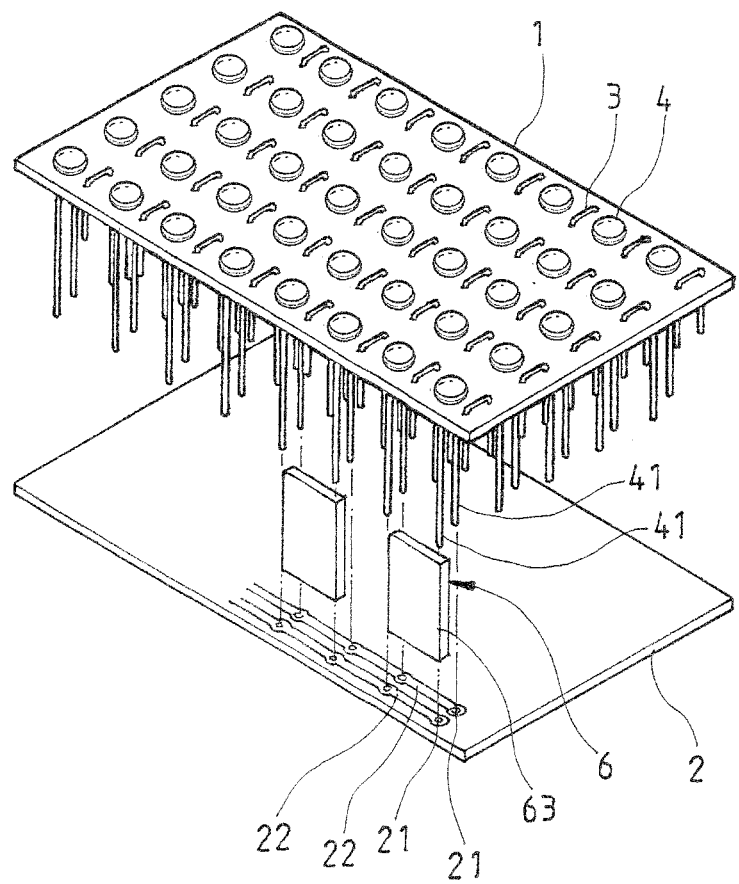
FIG. 8 is a perspective break-down diagram showing a heat dissipation device according to a third embodiment of the present invention.

As shown in FIG. 8, a heat dissipation device according to a third embodiment of the present invention employs heat dissipation pieces 6, each having only a piece body 63. The piece body 63 is positioned between the two leads 41 of a LED 4 and the two leads 41 are soldered to the piece body 63. The leads 41 are then threaded to the fourth plug holes 21 of the lower piece 2. The heat dissipation piece 6 then has its upper and lower edges against the upper and lower pieces 1 and 2, respectively.

When the LEDs 4 are turned on, the heat produced by the LEDs 4 is dissipated through the leads 41 which are reserved for an appropriate length, the conductive layers 14 and 22 on the upper and lower pieces 1 and 2 which have certain extended areas, and the heat dissipation pieces 6 between the leads 41 of the LEDs 4.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A heat dissipation device for a LED lamp, comprising:
   an upper piece having a plurality of first, second, and third plug holes wherein the second plug holes are aligned with a portion of the first plug holes, and these first and second plug holes are connected by separate conductive layers; the other first plug holes are also aligned and connected by separate conductive layers; the third plug holes are adjacent to the second plug holes and each third plug hole is configured on an individual conductive layer;
   at least a lower piece having a plurality of fourth plug holes, each corresponding to a first plug hole on the upper piece 1 wherein the fourth plug holes are aligned and connected by separate conductive layers;
   a plurality of sleeves sandwiched between the upper and lower pieces and the two ends of each sleeve are against the upper and lower pieces;
   a plurality of LEDs, each having leads of appropriate length threaded through the first plug holes, a sleeve, and the fourth plug holes, and soldered to the corresponding conductive layers of the upper and lower pieces, respectively; and
   a plurality of heat dissipation elements having the ends threaded through the second and third plug holes and soldered to the corresponding conductive layers of the upper piece;
   wherein, when the LEDs are turned on, the heat produced by the LEDs is dissipated through the leads which are reserved for an appropriate length, the conductive layers on the upper and lower pieces which have extended areas, and the heat dissipation elements among the LEDs.

2. The heat dissipation device according to claim 1, wherein the upper and lower pieces are circuit boards; and the conductive layers are the printed circuits on the circuit boards.

3. The heat dissipation device according to claim 2, wherein the printed circuits on the circuit board can be single-side or two-sided.

4. The heat dissipation device according to claim 1, wherein the heat dissipation element is of a reversed-U shape; and is made of iron or similar heat dissipating metallic material.

5. A heat dissipation device for a LED lamp, comprising:
   an upper piece having a plurality of first, second, and third plug holes wherein the second plug holes are aligned with a portion of the first plug holes, and these first and second plug holes are connected by separate conductive layers; the other first plug holes are also aligned and connected by separate conductive layers; the third plug holes are adjacent to the second plug holes and each third plug hole is configured on an individual conductive layer;

at least a lower piece having a plurality of fourth plug holes, each corresponding to a first plug hole on the upper piece 1 wherein the fourth plug holes are aligned and connected by separate conductive layers;

a plurality of heat dissipation pieces sandwiched between the upper and lower pieces, each heat dissipation piece having a piece body whose two lateral sides are configured with tubular sections, respectively, each tubular section having an axially extended slot opening, and the upper and lower edge of each heat dissipation piece against the upper and lower pieces;

a plurality of LEDs, each having leads of appropriate length threaded through the first plug holes, a sleeve section, and the fourth plug holes, and soldered to the corresponding conductive layers of the upper and lower pieces, respectively; and a plurality of heat dissipation elements having the ends threaded through the second and third plug holes and soldered to the corresponding conductive layers of the upper piece;

wherein, when the LEDs are turned on, the heat produced by the LEDs is dissipated through the leads which are reserved for an appropriate length, the conductive layers on the upper and lower pieces which have extended areas, the heat dissipation elements among the LEDs, and the heat dissipation pieces between the upper and lower pieces.

6. The heat dissipation device according to claim 5, wherein the upper and lower pieces are circuit boards; and the conductive layers are the printed circuits on the circuit boards.

7. The heat dissipation device according to claim 6, wherein the printed circuits on the circuit board can be single-side or two-sided.

8. The heat dissipation device according to claim 5, wherein the heat dissipation element is of a reversed-U shape; and is made of iron or similar heat dissipating metallic material.

9. A heat dissipation device for a LED lamp, comprising:

an upper piece having a plurality of first, second, and third plug holes wherein the second plug holes are aligned with a portion of the first plug holes, and these first and second plug holes are connected by separate conductive layers; the other first plug holes are also aligned and connected by separate conductive layers; the third plug holes are adjacent to the second plug holes and each third plug hole is configured on an individual conductive layer;

at least a lower piece having a plurality of fourth plug holes, each corresponding to a first plug hole on the upper piece 1 wherein the fourth plug holes are aligned and connected by separate conductive layers;

a plurality of heat dissipation pieces sandwiched between the upper and lower pieces, each heat dissipation piece positioned between the leads of each LED and having a piece body, and the upper and lower edge of each heat dissipation piece against the upper and lower pieces;

a plurality of LEDs, each having leads of appropriate length threaded through the first plug holes, and the fourth plug holes, and soldered to the heat dissipation pieces, and the corresponding conductive layers of the upper and lower pieces, respectively; and a plurality of heat dissipation elements having the ends threaded through the second and third plug holes and soldered to the corresponding conductive layers of the upper piece;

wherein, when the LEDs are turned on, the heat produced by the LEDs is dissipated through the leads which are reserved for an appropriate length, the conductive layers on the upper and lower pieces which have extended areas, the heat dissipation elements among the LEDs, and the heat dissipation pieces between the upper and lower pieces.

10. The heat dissipation device according to claim 5, wherein the upper and lower pieces are circuit boards; and the conductive layers are the printed circuits on the circuit boards.

11. The heat dissipation device according to claim 10, wherein the printed circuits on the circuit board can be single-side or two-sided.

12. The heat dissipation device according to claim 9, wherein the heat dissipation element is of a reversed-U shape; and is made of iron or similar heat dissipating metallic material.

* * * * *